(12) United States Patent
Feldman (10) Patent No.: US 7,634,754 B2
(45) Date of Patent: Dec. 15, 2009

(54) SIMULATION OF AERIAL IMAGES (75) Inventor: Haim Feldman, Nof-Ayalon (IL)

(73) Assignee: Applied Materials, Israel, Ltd., Rehovot (IL)

( * ) Notice: Subject to any disclaimer, the term of this patent is extended or adjusted under 35 U.S.C. 154(b) by 6 days.

(21) Appl. No.: 11/967,511

(22) Filed: Dec. 31, 2007

(65) Prior Publication Data

US 2008/0152234 A1  Jun. 26, 2008

Related U.S. Application Data

(62) Division of application No. 10/928,537, filed on Aug. 27, 2004, now Pat. No. 7,331,033.

(51) Int. Cl.
*G06F 17/50* (2006.01)
*G03F 1/00* (2006.01)
*G21K 5/00* (2006.01)
*G06F 19/00* (2006.01)

(52) U.S. Cl. .............. 716/21; 430/5; 378/35; 700/120; 700/121

(58) Field of Classification Search .......... 716/21; 430/4–5; 378/34–35; 700/119–121
See application file for complete search history.

(56) References Cited

U.S. PATENT DOCUMENTS 5,795,688 A * 8/1998 Burdorf et al. .......... 430/30
6,223,139 B1 4/2001 Wong et al.
6,368,763 B2 * 4/2002 Dirksen et al. .......... 430/30
6,738,859 B2 * 5/2004 Liebchen .......... 716/19
7,079,223 B2 7/2006 Rosenbluth et al.
2002/0062206 A1 5/2002 Liebchen
2003/0140330 A1 7/2003 Tanaka et al.
2005/0149900 A1 7/2005 Laidig
2005/0149902 A1 7/2005 Shi et al.
2005/0185159 A1 8/2005 Rosenbluth et al.

FOREIGN PATENT DOCUMENTS

EP  1202119  2/2008

OTHER PUBLICATIONS

Adam et al., "Improved Modeling Performance with an Adapted Vectorial Formulation of the Hopkins Imaging Equasion", Proceedings of SPIE- vol. 5040, Optical Microlithography XVI, Anthony Yen, Editor, Jun. 2003, pp. 78-91.
Von Bunau, "Depth of Focus Enhancement in Optical Lithography" (PH.D. dissertation, Stanford University, Stanford, California, 1995).

(Continued)

*Primary Examiner*—Phallaka Kik
*Assistant Examiner*—Brandon W Bowers
(74) *Attorney, Agent, or Firm*—Tarek N. Fahmi (57) ABSTRACT

A method for generating a simulated aerial image of a mask projected by an optical system includes determining a coherence characteristic of the optical system. A coherent decomposition of the optical system is computed based on the coherence characteristic. The decomposition includes a series of expansion functions having angular and radial components that are expressed as explicit functions. The expansion functions are convolved with a transmission function of the mask in order to generate the simulated aerial image.

15 Claims, 7 Drawing Sheets

OTHER PUBLICATIONS

Toh, et al., in "Identifying and Monitoring Effects of Lens Aberrations on Projection Printing", Proceedings of the SPIE Microlithography Conference (1987), pp. 202-209.

Born & Wolf in Principles of Optics, 4th edition (Pergamon Press, 1970), in Section 9.2, pp. 464-467.

Ronald L. Gordon, et al., "Lithographic Image Simulation for the 21st Century with 19th- Century Tools", 2002.

S. Subramanian, "Rapid Calculation of Defocused Partially Coherent Images", Applied Optics, vol. 20, No. 10, May 1981.

R.M. Von Bunau, et al., "Optimal Coherent Decompositions for Radially Symmetric Optical Systems", J. Vac. Technol. B 15(6), Nov./Dec. 1997.

Y.C. Pati, et al., "Exploiting Structure in Fast Aerial Image Computation for Integrated Circuit Patterns", IEEE Transactions on Semiconductor Manufacturing, vol. 10, No. 1, Feb. 1997.

Oscar D. Crisalle, et al., "A Comparison of the Optical Projection Lithography Simulators in SAMPLE and PROLITH", IEEE Transactions on Semiconductor Manufacturing, vol. 5, No. 1, Feb. 1992.

* cited by examiner

SIMULATION OF AERIAL IMAGES

CROSS-REFERENCE TO RELATED APPLICATION

The present patent application is a DIVISIONAL of, claims priority to and incorporates by reference U.S. patent application Ser. No. 10/928,537, filed 27 Aug. 2004, which is related to U.S. patent application Ser. No. 10/928,390, filed 27 Aug. 2004, now U.S. Pat. No. 7,310,796 issued 18 Dec. 2007, entitled "System and Method for Simulating an Aerial Image," which is assigned to the assignee of the present patent application and whose disclosure is incorporated herein by reference.

FIELD OF THE INVENTION

The present invention relates generally to photolithography, and specifically to simulation of aerial images produced by projecting a mask onto a target surface.

BACKGROUND OF THE INVENTION

Photolithography is an essential tool in reproduction of fine patterns on a substrate, and is very widely used in production of microelectronic devices. As the design rules used in such devices become ever finer, mask designers must increasingly resort to reticle enhancement technologies, such as the use of serifs, assist lines and phase shift masks, in order to project the desired pattern onto the device substrate. The aerial image that is actually formed on the substrate is a complex function of the characteristics of the illumination source and optics that are used in the lithographic process and of diffraction and interference effects caused by the structures on the mask itself. Mask designers need simulation systems that model these effects in order to predict the pattern that will be formed on the substrate by particular arrangements of mask features.

Simulation of the aerial image is complicated by the fact that practical lithography systems use partially-coherent illumination. For optical systems that are nearly paraxial, the intensity of the aerial image at the image plane with partially-coherent illumination of the mask is given by the well-known Hopkins formula:

$$I(\vec{x}) = \int_S T(\vec{\eta}) \cdot T^*(\vec{\iota}) \cdot J(\vec{\eta} - \vec{\iota}) \cdot A^*(\vec{\eta} - \vec{\iota}) \cdot A^*(\vec{\iota} - \vec{x}) d\vec{\eta} d\vec{\iota} \quad (1)$$

Here T is the transmission function of the mask; J is the mutual coherence function of the illumination source (typically the Fourier transform of the condenser aperture function); and A is the point spread function (PSF) of the projection system. Formula (1) is a quadruple integral, taken over coordinates $\vec{\iota} = (\iota_1, \iota_2)$ and $\vec{\eta} = (\eta_1, \eta_2)$ in the mask plane. Although direct computation of this integral is possible, it becomes intractable for large-scale masks.

In order to reduce the complexity of aerial image simulation, a number of authors have suggested using optimal coherent decomposition (OCD) to approximate the optical properties of the partially-coherent imaging system as an incoherent sum of a finite number of coherent imaging systems. The aerial images that would be formed by each of the coherent imaging systems are then computed and summed together to give the total, simulated aerial image. Pati et al. provide a useful overview of OCD methods in "Exploiting Structure in Fast Aerial Image Computation for Integrated Circuit Patterns," *IEEE Transactions on Semiconductor Manufacturing* 10:1 (February, 1997), pages 62-73, which is incorporated herein by reference. This article describes the use of "basis" (or building block) images, which correspond to certain types of integrated circuit patterns, in order to compute aerial images by OCD.

Von Bunau et al. describe a related method of OCD in "Optimal Coherent Decompositions for Radially Symmetric Optical Systems," *Journal of Vacuum Science and Technology B* 15:6 (November/December, 1997), pages 2412-2416, which is incorporated herein by reference. The authors show that for optical systems that are radially symmetrical, the point spread functions and pupil functions corresponding to each term in the OCD expansion are separable in polar coordinates. They derive analytical expressions for the angular dependence of these terms and an integral equation for the radial dependence.

A number of methods for aerial image simulation have been described in the patent literature. For example, U.S. Pat. No. 6,223,139, whose disclosure is incorporated herein by reference, describes kernel-based fast aerial image computation for a large-scale design of integrated circuit patterns. The method is based on determining an appropriate sampling range and sampling interval for use in generating simulated aerial images of a mask pattern, so as to enhance computation speed without sacrificing accuracy. U.S. Patent Application Publication 2002/0062206, whose disclosure is also incorporated herein by reference, describes a method for fast aerial image simulation, using a kernel that is calculated based on an orthogonal pupil projection of the parameters of the optical projection system onto a basis set. A vector is calculated based on an orthogonal mask projection of the parameters of the mask onto the basis set, and the field intensity distribution in the image plane is then calculated using the kernel and the vector.

SUMMARY OF THE INVENTION

Embodiments of the present invention provide improved methods and systems for computing a coherent decomposition of a partially-coherent optical system. The decomposition uses expansion functions, including both radial and angular components, which are expressed in explicit form, thus providing greater ease and speed of computation than OCD methods known in the art. The methods of OCD taught by the present invention are particularly useful in simulating aerial images produced by a projection system, such as the aerial image projected by a photolithographic mask.

In some embodiments of the present invention, the radial components of the expansion functions comprise Bessel functions. These functions typically depend, inter alia, on the degree of coherence of the optical system, σ, which is expressed as a ratio of the numerical aperture (NA) of the illumination optics to the NA of the projection optics. Additionally or alternatively, the expansion functions may contain polynomial functions, such as Zernike polynomials, in order to account for the effect of aberrations in the optical system.

In some embodiments of the present invention, OCD is applied to simulate aerial images that are produced by a mask under inspection in a mask inspection system. The system reads the mask transmission function from a design database, and computes a simulated aerial image based on the transmission function and on the optical characteristics of the mask inspection system. An imaging device, such as an electronic imaging camera, captures the actual aerial image that is formed by the mask in the inspection system, and an image processor compares the actual image to the simulated image. When the processor finds a significant deviation between the actual and simulated aerial images, it notes the corresponding location on the mask as a potential defect site. This approach permits detection of defects, such as phase defects, that are not visible under direct inspection.

In other embodiments of the present invention, OCD is used to measure the aberrations of an optical projection system, by comparing a simulated aerial image to an actual aerial image of a known reference pattern. In these embodiments, the expansion functions are used to generate the simulated image assuming small aberrations of variable magnitude. The magnitude of the aberrations is then adjusted so as to fit the simulated image to the actual image. The optimal fit parameters indicate the magnitudes of the actual aberrations.

There is therefore provided, in accordance with an embodiment of the present invention, a method for generating a simulated aerial image of a mask projected by an optical system, including:

determining a coherence characteristic of the optical system;

computing a coherent decomposition of the optical system based on the coherence characteristic, the decomposition including a series of expansion functions having angular and radial components that are expressed as explicit functions; and convolving the expansion functions with a transmission function of the mask in order to generate the simulated aerial image.

Typically, determining the coherence characteristic includes calculating a coherence ratio of the optical system. In a disclosed embodiment, the expansion functions are components of eigenfunctions of a kernel function representing characteristics of the optical system, and computing the coherent decomposition includes determining the expansion functions without computing eigenvalues of the kernel function.

In some embodiments, computing the coherent decomposition includes determining one or more aberrations of the optical system, and computing the expansion functions responsively to the aberrations. Typically, determining the one or more aberrations includes representing a point spread function (PSF) of the optical system as a series of aberration terms having respective coefficients, and computing the expansion functions includes calculating the expansion functions responsively to the respective coefficients of the aberration terms. In one embodiment, calculating the expansion functions includes expressing the PSF as a Taylor series in terms of the coefficients of the aberration terms. Additionally or alternatively, computing the expansion functions includes calculating the expansion functions responsively to a defocus of the optical system.

There is also provided, in accordance with an embodiment of the present invention, a method for generating a simulated aerial image of a mask projected by an optical system, including:

defining a kernel function representing characteristics of the optical system;

computing a coherent decomposition of the optical system into a series of expansion functions, which are components of eigenfunctions of the kernel function, without computing eigenvalues of the kernel function; and convolving the expansion functions with a transmission function of the mask in order to generate the simulated aerial image.

There is additionally provided, in accordance with an embodiment of the present invention, a method for inspecting a mask, including:

projecting radiation through the mask using an optical system so as to form an actual aerial image;

deriving a transmission function from a design of the mask;

generating a simulated aerial image by convolving a mathematical model of the optical system with the transmission function; and comparing the simulated aerial image to the actual aerial image in order to identify a defect in the mask.

There is further provided, in accordance with an embodiment of the present invention, a method for determining characteristics of an optical system, including:

projecting radiation through a mask using the optical system so as to form a reference aerial image;

generating a simulated aerial image by convolving a transmission function of the mask with a mathematical model of the optical system, the model including a variable parameter representative of a magnitude of an aberration of the optical system; and comparing the simulated aerial image to the reference aerial image in order to determine the magnitude of the aberration.

In some embodiments, comparing the simulated aerial image to the reference aerial image includes defining an error function responsively to a difference between the simulated aerial image to the reference aerial image, and varying the parameter so as to minimize the error function. Typically, generating the simulated aerial image includes representing a point spread function (PSF) of the optical system as a series of aberration terms having respective coefficients, and varying the parameter includes adjusting the respective coefficients of the aberration terms. In one embodiment, representing the PSF includes expressing the PSF as a Taylor series in terms of the coefficients of the aberration terms.

In another embodiment, generating the simulated aerial image includes representing a point spread function (PSF) of the optical system in terms of a defocus of the optical system, and varying the parameter includes determining a magnitude of the defocus. Typically, representing the PSF includes expressing the PSF as a product of a first series of first terms representing the defocus by a second series of second terms representing the aberration.

In a disclosed embodiment, generating the simulated aerial image includes determining a coherence characteristic of the optical system, and creating the mathematical model as a coherent decomposition of the optical system based on the coherence characteristic, the decomposition including a series of expansion functions having angular and radial components that are expressed as explicit functions. Additionally or alternatively, generating the simulated aerial image includes defining a kernel function representing characteristics of the optical system, an creating the mathematical model as a coherent decomposition of the optical system into a series of expansion functions, which are components of eigenfunctions of the kernel function, without computing eigenvalues of the kernel function.

There is moreover provided, in accordance with an embodiment of the present invention, apparatus for generating a simulated aerial image of a mask projected by an optical system, including:

a memory, which is arranged to store a transmission function of a mask; and an image processor, which is adapted to compute a coherent decomposition of the optical system based on a coherence characteristic of the optical system, the decomposition including a series of expansion functions having angular and radial components that are expressed as explicit functions, to read the transmission function from the memory, and to convolve the expansion functions with the transmission function in order to generate the simulated aerial image.

There is furthermore provided, in accordance with an embodiment of the present invention, apparatus for generating a simulated aerial image of a mask projected by an optical system, including:

a memory, which is arranged to store a transmission function of a mask; and an image processor, which is adapted to receive a definition of a kernel function representing characteristics of the optical system, and to compute a coherent decomposition of the optical system into a series of expansion functions, which are components of eigenfunctions of the kernel function, without computing eigenvalues of the kernel function, and to read the transmission from the memory and convolve the expansion functions with the transmission function in order to generate the simulated aerial image.

There is also provided, in accordance with an embodiment of the present invention, apparatus for inspecting a mask, including:

an optical system, which is adapted to project radiation through the mask so as to form an actual aerial image; and an image processor, which is coupled to receive the actual aerial image and is adapted, responsively to a transmission function derived from a design of the mask, to generate a simulated aerial image by convolving a mathematical model of the optical system with the transmission function, and to compare the simulated aerial image to the actual aerial image in order to identify a defect in the mask.

There is additionally provided, in accordance with an embodiment of the present invention, apparatus for determining characteristics of an optical system, including:

an imaging device, which is arranged capture a reference aerial image formed by projecting radiation through a mask using the optical system; and an image processor, which is adapted to generate a simulated aerial image by convolving a transmission function of the mask with a mathematical model of the optical system, the model including a variable parameter representative of a magnitude of an aberration of the optical system, and to compare the simulated aerial image to the reference aerial image in order to determine the magnitude of the aberration.

There is further provided, in accordance with an embodiment of the present invention, a computer software product for generating a simulated aerial image of a mask projected by an optical system, the product including a computer-readable medium in which program instructions are stored, which instructions, when read by a computer, cause the computer to compute a coherent decomposition of the optical system based on a coherence characteristic of the optical system, the decomposition including a series of expansion functions having angular and radial components that are expressed as explicit functions, and to convolve the expansion functions with a transmission function of the mask in order to generate the simulated aerial image.

There is moreover provided, in accordance with an embodiment of the present invention, a computer software product for generating a simulated aerial image of a mask projected by an optical system, the product including a computer-readable medium in which program instructions are stored, which instructions, when read by a computer, cause the computer to compute a coherent decomposition of the optical system into a series of expansion functions, which are components of eigenfunctions of a kernel function representing characteristics of the optical system, without computing eigenvalues of the kernel function, and to convolve the expansion functions with a transmission function of the mask in order to generate the simulated aerial image.

There is furthermore provided, in accordance with an embodiment of the present invention, a computer software product for use in inspection of a mask, the product including a computer-readable medium in which program instructions are stored, which instructions, when read by a computer, cause the computer to receive an actual aerial image of the mask projected by an optical system, and responsively to a transmission function derived from a design of the mask, to generate a simulated aerial image by convolving a mathematical model of the optical system with the transmission function, and to compare the simulated aerial image to the actual aerial image in order to identify a defect in the mask.

There is also provided, in accordance with an embodiment of the present invention, a computer software product for determining characteristics of an optical system, the product including a computer-readable medium in which program instructions are stored, which instructions, when read by a computer, cause the computer to receive a reference aerial image formed by projecting radiation through a mask using the optical system, and to generate a simulated aerial image by convolving a transmission function of the mask with a mathematical model of the optical system, the model including a variable parameter representative of a magnitude of an aberration of the optical system, and to compare the simulated aerial image to the reference aerial image in order to determine the magnitude of the aberration.

The present invention will be more fully understood from the following detailed description of the embodiments thereof, taken together with the drawings in which:

DETAILED DESCRIPTION OF EMBODIMENTS

Figure 1:
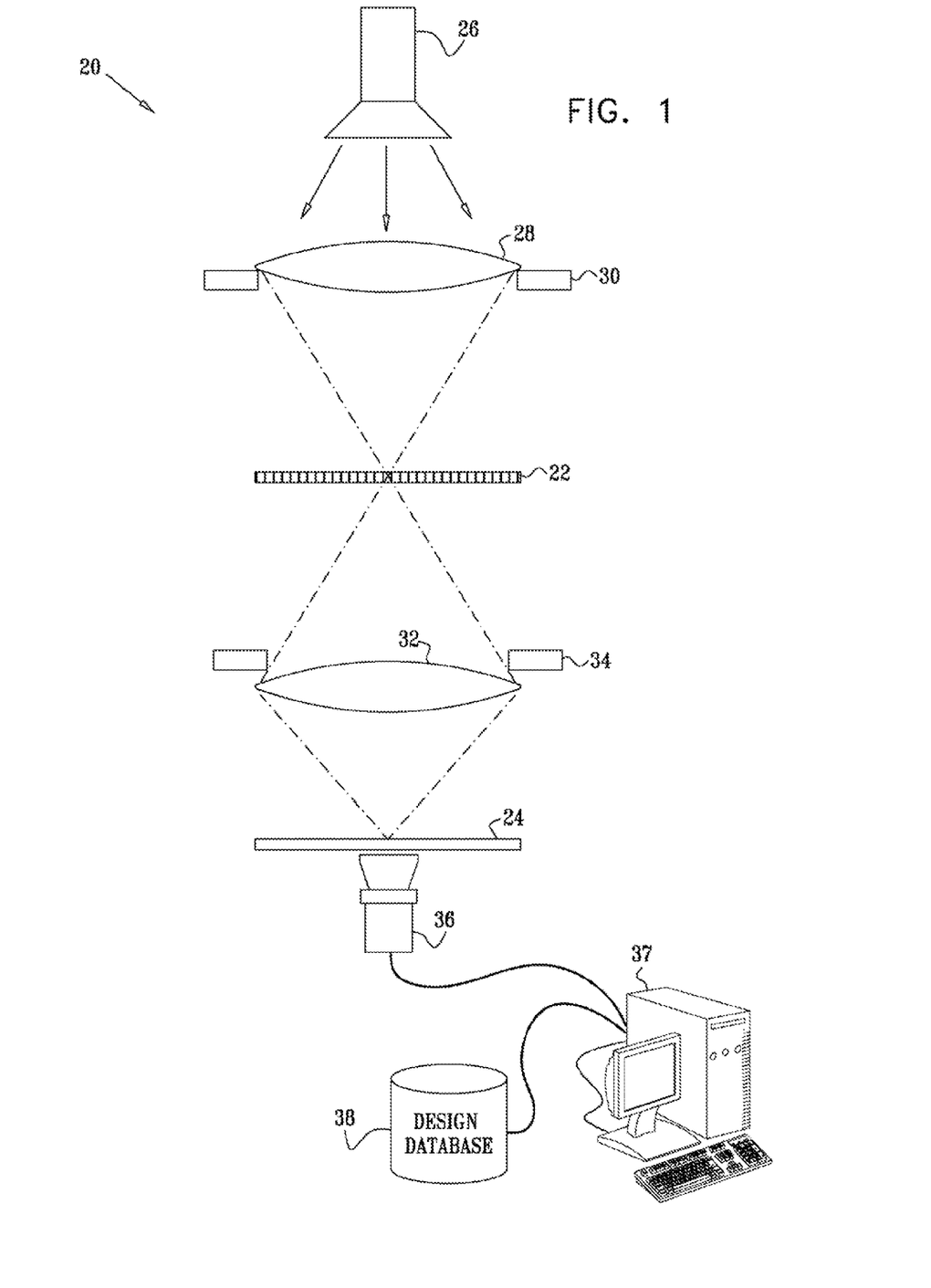
FIG. 1 is a schematic side view of a system for mask projection and inspection, in accordance with an embodiment of the present invention.

FIG. 1 is a schematic side view of a system 20 for projection of a mask 22 onto a target plane 24, in accordance with an embodiment of the present invention. Typically, mask 22 embodies a predetermined design for a thin film layer that is to be formed by photolithography on a substrate at plane 24, as is known in the art. The design is characterized by a complex transmission function $T(\vec{x})$. Alternatively, system 20 may be used in projection of patterns of other types, and the term "mask" should be understood to comprise substantially any sort of object carrying a pattern that can be projected in this manner onto a target plane. Furthermore, the principles of the present invention may also be applied in projection systems that are based on reflection of radiation from mask 22, as well as other types of systems that use optical projection and/or microscopy.

An illumination source 26 emits radiation, which typically comprises visible, ultraviolet or infrared radiation. A condenser lens 28, having an aperture 30, focuses the light from source 26 through mask 22. A projection lens 32, having an aperture 34, focuses an aerial image of mask 22 onto plane 24. Typically, lenses 28 and 32 comprise complex, multi-element lenses. The respective apertures 30 and 34 and respective distances of lenses 28 and 32 from mask 22 define respective numerical apertures, $NA_{illumination}$ and $NA_{aperature}$, as is known in the art. The coherence ratio of system 20 is then given by:

$$\sigma = \frac{NA_{illumination}}{NA_{projection}} \quad (2)$$

More generally, the term $NA_{aperture}$ may be replaced by the numerical aperture of the collection optics, $NA_{collection}$. Typically, the higher the coherence of the illumination, the lower will be the value of σ.

System 20 may be used, as well, for inspection of mask 22, typically for purposes of detecting mask defects. In this case, an electronic imaging device, such as a video camera 36, captures the actual aerial image formed at plane 24 with high resolution. An image processor 37 generates a simulated aerial image, based on the known design of mask 22, which is stored in a design database 38. The mask design determines the transmission function $T(\vec{x})$. The simulated aerial image is computed, using novel techniques that are described hereinbelow, based on $T(\vec{x})$ and on the optical characteristics of system 20. Image processor 37 compares the actual aerial image to the simulated aerial image, in order to detect discrepancies between the two, which may be indicative of defects in mask 22. Generally speaking, the image processor marks the locations of these defects for further inspection, cleaning or repair, as appropriate.

Image processor 37 typically comprises a general-purpose computer, which performs the functions described in the present patent application under the control of suitable software. The software may be downloaded to the computer in electronic form, over a network, for example, or it may alternatively be provided on tangible media, such as optical, magnetic or non-volatile electronic storage media. Alternatively or additionally, at least some of the functions of the image processor may be performed by dedicated or programmable hardware components, such as a digital signal processor.

Figure 2:
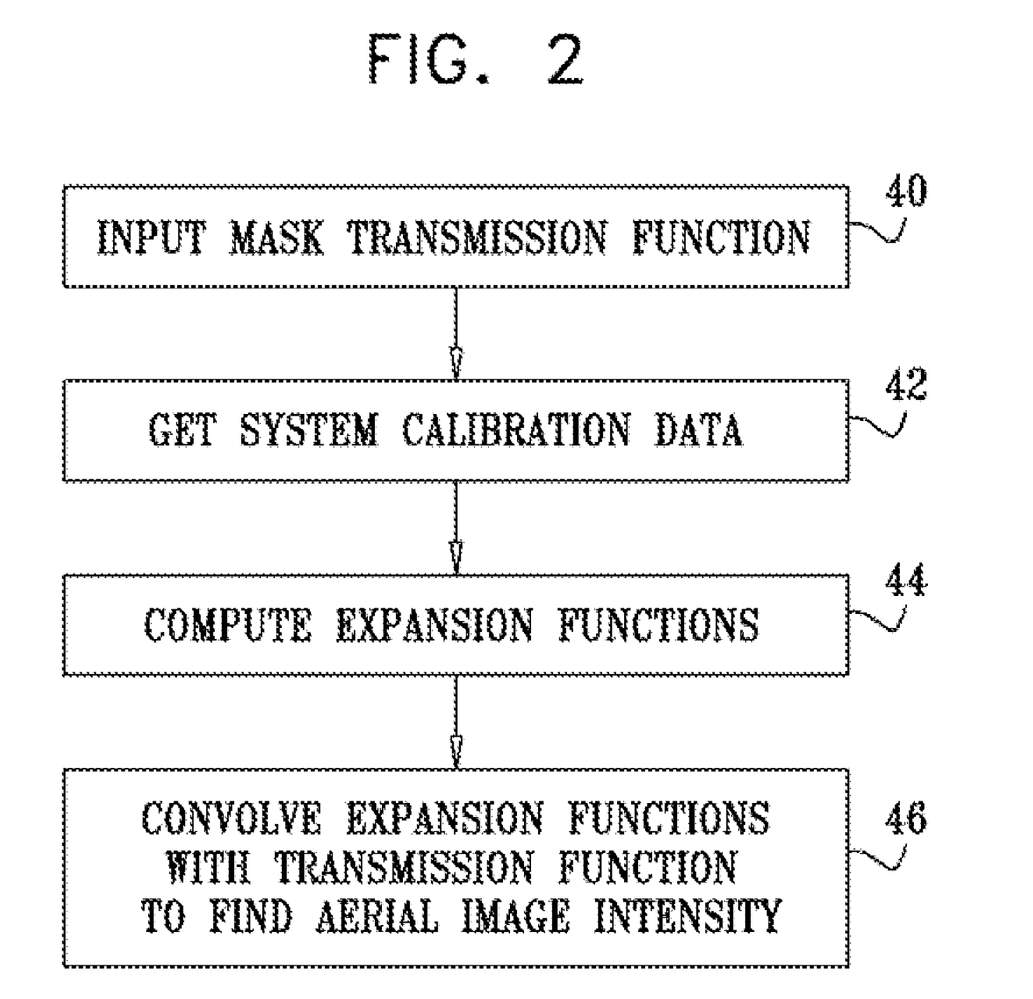
FIG. 2 is a flow chart that schematically illustrates a method for aerial image simulation, in accordance with an embodiment of the present invention.

FIG. 2 is a flow chart that schematically illustrates a method for aerial image simulation, in accordance with an embodiment of the present invention. The simulated aerial image that is determined in this fashion may be used for finding defects in mask 22, as described above. Alternatively, the simulated aerial image may be used for other purposes, such as testing the expected performance of mask 22 during the design stage to verify that the mask will create the precise, desired features by photolithography on a semiconductor wafer. Further alternatively or additionally, the simulated aerial image may be used in measuring optical aberrations in system 20, as described hereinbelow with reference to FIG. 7. Other applications of these simulated aerial images will be apparent to those skilled in the art.

As a preliminary step, processor 37 reads data defining the design of mask 22 from database 38, at a mask transmission input step 40. The data may include the actual transmission function $T(\vec{x})$ of the mask. Alternatively, the processor may compute the transmission function in a straightforward manner based on the layout of opaque and phase-shifting elements in the mask design. Processor 37 also reads in or determines calibration data regarding projection system 20, at a system parameter input step 42. These data enable the processor to calculate the coherence ratio of the system, as given by equation. In addition, to the extent that known aberrations in projection lens 32 are to be taken into account, as described hereinbelow with reference to FIG. 5, the calibration data may include a model of the aberrations.

Based on the optical characteristics of system 20, processor 37 computes a set of expansion functions for use in modeling aerial images produced by the system, at an expansion step 44. The derivation of these expansion functions is described in detail in Appendix A. Briefly, in an ideal, cylindrically-symmetrical system, without aberrations, the functions and coordinates appearing in the Hopkins formula (equation (1)) may be expressed in polar coordinates as follows:

$$A(\vec{\eta}) = \frac{J_1(\rho_1)}{\rho_1}; A(\vec{\iota}) = \frac{J_1(\rho_2)}{\rho_2}; \quad (3)$$

$$J(|\vec{\eta} - \vec{\iota}|) = \frac{J_1\left(\sigma\sqrt{\rho_1 + \rho_2 - 2\rho_1\rho_2\cos(\theta)}\right)}{\sigma\sqrt{\rho_1 + \rho_2 - 2\rho_1\rho_2\cos(\theta)}};$$

$$\eta_x = \rho_1\cos(\theta_1); \eta_y = \rho_1\sin(\theta_1);$$

$$\iota_x = \rho_2\cos(\theta_2); \iota_y = \rho_2\sin(\theta_2);$$

$$\theta = \theta_1 - \theta_2;$$

In these equations, $J_1$ is the first-order Bessel function, and ρ is a normalized radial coordinate given by:

$$\rho = \frac{2\pi}{\lambda}NA_{projection} \cdot \sqrt{(x^2 + y^2)} \quad (4)$$

The transmission function T may similarly be converted to polar coordinates.

The part of the Hopkins formula that is dependent on the optical system can be expressed in terms of an optimal coherent decomposition (OCD) of a kernel K into a truncated series of eigenfunctions $\phi_i$:

$$K(\rho_1, \rho_2, \theta_1, \theta_2) = A(\vec{\eta}) \cdot A^*(\vec{\iota}) \cdot J(|\vec{\eta} - \vec{\iota}|) \quad (5)$$

$$= \sum_{i=1}^{n} \lambda_i \cdot \phi_i(\rho_1, \theta_1) \cdot \phi_i(\rho_2, \theta_2)$$

The eigenvalues $\lambda_i$ and eigenfunctions $\phi_i$ in equation (5) are solutions of the inhomogeneous Fredholm equation:

$$\int_0^\infty \int_0^{2\pi} K(\rho_1, \rho_2, \theta_1, \theta_2)\rho_2\phi(\rho_2, \theta_2)d\rho_2d\theta_2 = \lambda\phi(\rho_1, \theta_1) \quad (6)$$

As shown in Appendix A, equation (6) can be solved explicitly, using the coherence ratio σ and equations (3), to give the following set of eigenfunctions:

$$^c\phi_i^m(\rho, \theta) = \sqrt{2} \sum_{k=m}^{M} B_k^{m,i} \sqrt{(1+k)} \frac{J_1(\rho)}{\rho} \cdot \frac{J_{1+k}(\sigma\rho)}{\sigma\rho} \cos(m\theta) \quad (7)$$

$$^s\phi_i^m(\rho, \theta) = \sqrt{2} \sum_{k=m}^{M} B_k^{m,i} \sqrt{(1+k)} \frac{J_1(\rho)}{\rho} \cdot \frac{J_{1+k}(\sigma\rho)}{\sigma\rho} \sin(m\theta)$$

Here $J_n(\rho)$ is the nth-order Bessel function, $m \geq 0$ is an angular index, and the terms $B_k^{m,i}$ are eigenvectors, whose derivation is described in detail below in Appendix A. The upper bound M is chosen heuristically so that the residual error in computation of the eigenfunctions is within a desired limit.

Figure 3:
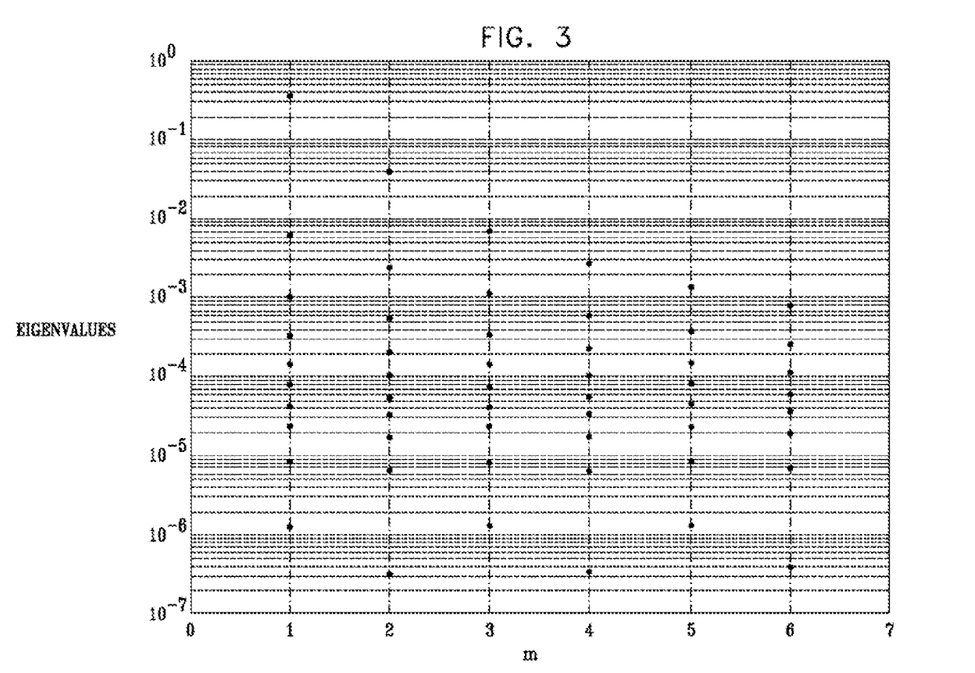
FIG. 3 is a plot showing eigenvalues of an OCD expansion, in accordance with an embodiment of the present invention.
Figure 4A:
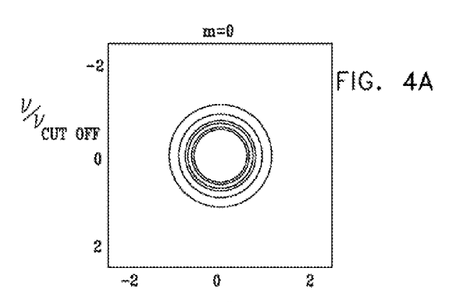
FIGS. 4A-4D are plots that schematically illustrate eigenfunctions found in an OCD expansion, in accordance with an embodiment of the present invention.
Figure 4B:
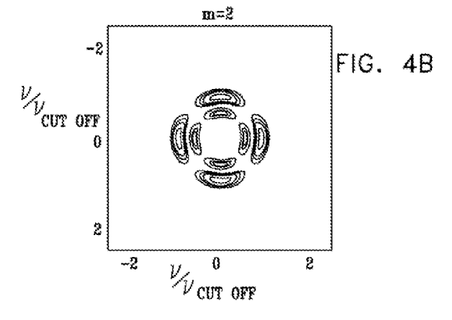
Figure 4C:
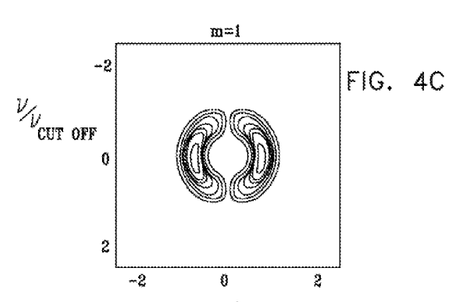
Figure 4D:
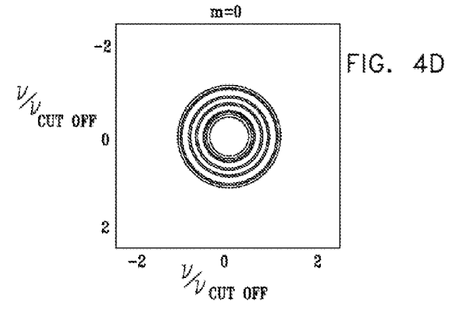

Reference is now made to FIGS. 3 and 4A-D, which illustrate an exemplary solution to equation (6) for $\sigma=0.5$, in accordance with an embodiment of the present invention. FIG. 3 shows the set of eigenvalues $\lambda_i$, arranged as a function of the angular index m. FIGS. 4A-D show the spatial Fourier transforms of the first four eigenfunctions, i.e., the eigenfunctions that correspond to the four greatest eigenvalues, as given by equation (7). The spatial frequency $\nu$ in FIGS. 4A-D is normalized in terms of the cutoff frequency $$\nu_{cutoff} = \frac{NA_{projection}}{\lambda} \left[ \frac{lp}{mm} \right].$$

It can be shown that the frequency spectra of the eigenfunctions contain no components whose frequency is greater than $\nu_{max} = (1+\sigma)\nu_{cutoff}$.

It will be observed that the eigenvalues shown in FIG. 3 drop rapidly with increasing order. The error incurred by truncating the OCD series of equation (5) after n terms is bounded by $$\varepsilon = \sum_{i=n+1}^{\infty} \lambda_i^2.$$

The value of n can thus be chosen based on the desired error bound in the simulated aerial image. The inventor has found that for low values of $\sigma$ (about 0.3 or less), 5-10 terms are sufficient to give an error bound of 1/256, while higher values of $\sigma$ require more terms, typically as many as 50 terms for $\sigma=0.8$, for example. Furthermore, it can be shown that if $m_1 > m_2$, then the first eigenvalue corresponding to angular index $m_1$ will always be greater than the first eigenvalue corresponding to angular index $m_2$. Therefore, it is sufficient to compute the eigenfunctions of equation (7) out to angular index n in order to be assured of including at least the first n eigenfunctions (in order of magnitude of the corresponding eigenvalues).

This result is used in determining the number of expansion functions that must be computed at step 44. The expansion functions $\Theta_{m,k}$ are defined as follows:

$$^c\phi_i^m(\rho, \theta) = \sum_{k=m}^{M} B_k^{m,i} \Theta_{m,k}^c(\rho, \theta) \cos(m\theta) \quad (8)$$

$$^s\phi_i^m(\rho, \theta) = \sum_{k=m}^{M} B_k^{m,i} \Theta_{m,k}^s(\rho, \theta) \sin(m\theta)$$

So that:

$$\Theta_{m,k}^c(\rho, \theta) = \sqrt{(1+k)} \frac{J_1(\rho)}{\rho} \cdot \frac{J_{1+k}(\sigma\rho)}{\sigma\rho} \cos(m\theta) \quad (9)$$

$$\Theta_{m,k}^s(\rho, \theta) = \sqrt{(1+k)} \frac{J_1(\rho)}{\rho} \cdot \frac{J_{1+k}(\sigma\rho)}{\sigma\rho} \sin(m\theta)$$

In other words, the expansion functions are determined independently of the eigenvectors of equation (5). Alternatively, the eigenfunctions themselves, as given by equation (7), for example, may be used as the expansion functions.

Returning to equations (1) and (5), the aerial image intensity at each point in target plane 24 is given by:

$$I(\vec{x}) = T \otimes K \quad (10)$$

$$= \sum_{m=0}^{M} \sum_{i=1}^{n} \lambda_i \{ |T \otimes {}^c\phi_i^m|^2 + |T \otimes {}^s\phi_i^m|^2 \}$$

wherein the symbol $\otimes$ represents convolution. In order to carry out this computation without having to compute the actual eigenvalues, processor 37 convolves the transmission function of mask 22 with the expansion functions of the optical system, at a convolution step 46, giving the convolution components:

$$\psi_{m,i}^C(\rho,\theta) \equiv \Theta_{m,k}^C(\rho,\theta) \otimes T(\rho,\theta)$$

$$\psi_{m,i}^S(\rho,\theta) \equiv \Theta_{m,k}^S(\rho,\theta) \otimes T(\rho,\theta) \quad (11)$$

wherein $i=k-m$. Due to the orthogonality of the eigenvectors, substitution of the expansion functions into equation (10) in place of the eigenfunctions permits the equation to be rewritten in terms of the convolution components:

$$I(\vec{x}) = \sum_{m=0}^{M} \sum_{i=1}^{n} |\psi_{m,i}^c|^2 + |\psi_{m,i}^s|^2 \quad (12)$$

Thus, the aerial image intensity may be computed explicitly, to arbitrary precision, based on the expansion functions $\Theta_{m,k}$ and the known mask transmission function T.

Figure 5:
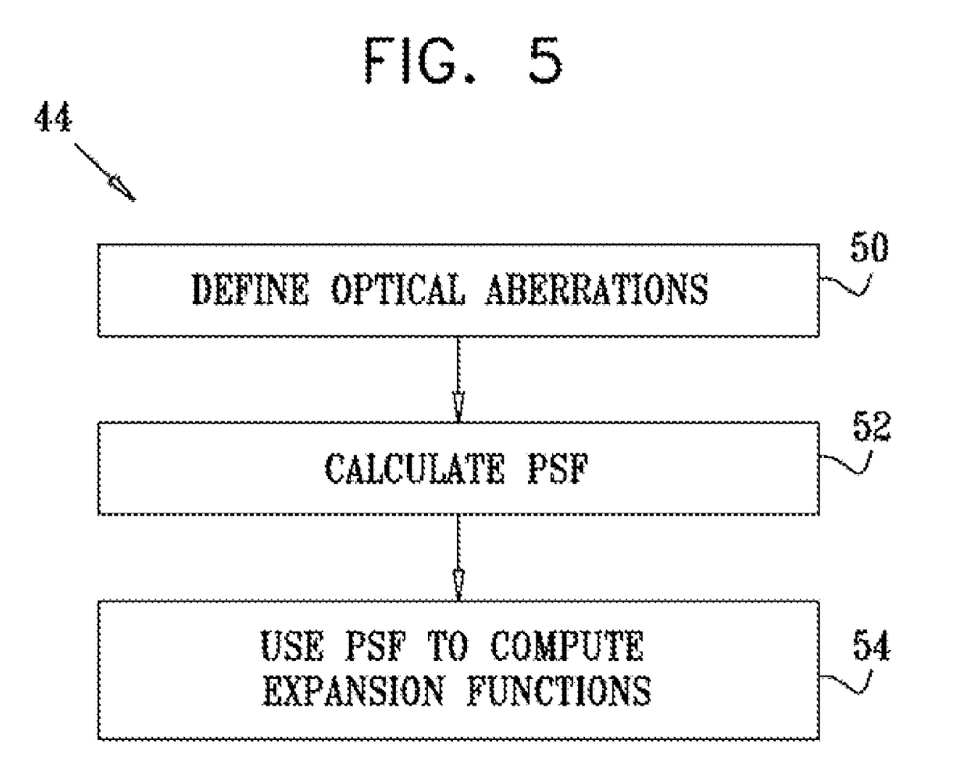
FIG. 5 is a flow chart that schematically illustrates a method for computing expansion functions for use in simulating an aerial image, in accordance with an embodiment of the present invention.

FIG. 5 is a flow chart that schematically illustrates a method for computing the expansion functions (at step 44 in FIG. 2) to take into account aberrations in system 20, in accordance with an embodiment of the present invention. In the derivation above, ideal optics were assumed in equations (3), so that the point spread function (PSF) of the projection system could be expressed as $$A(\rho, \theta) = \frac{J_1(\rho)}{\rho},$$

leading to the form of the eigenfunctions that is given above in equations (7). Alternatively, however, the full polar form of the PSF may be carried through the derivation, leading to the more general form of the eigenfunctions:

$$^c\phi_i^m(\rho, \theta) = \qquad \text{[equation (13)]}$$

$$\sqrt{2}\sum_{k=1}^{M} B_k^{m,i}\sqrt{(1+k)} \cdot A(\rho, \theta)\frac{J_{1+k}(\sigma\rho)}{\sigma\rho}\cos((k-2m)\theta)$$

$$^s\phi_i^m(\rho, \theta)\sqrt{2}$$

$$\sum_{k=1}^{M} B_k^{m,i}\sqrt{(1+k)} \cdot A(\rho, \theta)\frac{J_{1+k}(\sigma\rho)}{\sigma\rho}\sin((k-2m)\theta)$$

Thus, in the embodiment shown in FIG. 5, in order to compute the expansion functions, processor 37 receives a definition of the optical aberrations of system 20, at an aberration definition step 50. Based on these aberrations, the processor calculates the PSF of the system, $A(\rho,\theta)$, at a PSF determination step 52. For small aberrations, the PSF may be expressed as a combination of Bessel functions representing the aberrations that are present in the system:

$$A_{astigmatic} \approx \frac{2J_1(\rho)}{\rho} - i\alpha_{astig}\frac{2J_3(\rho)}{\rho}\cos(2\theta) \qquad (14)$$

$$A_{coma} \approx \frac{2J_1(\rho)}{\rho} - \alpha_{coma}\frac{2J_4(\rho)}{\rho}\cos\theta$$

$$A_{spherical} \approx \frac{2J_1(\rho)}{\rho} + i\alpha_{spherical}\frac{2J_5(\rho)}{\rho}$$

In each of these equations, $\alpha$ represents the magnitude of the corresponding aberration. Based on these equations, it is possible to use expressions for the eigenfunctions $\phi$ or expansion functions $\Theta$ in calculating the simulated aerial image.

Alternatively, the PSF of system 20 may be expressed as the truncated Fourier transform (limited to the radial range from 0 to 1) of the aperture function:

$$A(\rho, \theta) = \frac{i}{\lambda}E \cdot NA^2 e^{i \cdot NA^2 u} \qquad \text{[equation (15)]}$$

$$\int_0^1 \int_0^{2\pi} \eta \cdot d\eta \cdot d\varphi \cdot e^{i[-\eta\rho\cos(\theta-\varphi)+k\Phi(Y^*,\varphi,\eta)-\frac{1}{2}u\eta^2]}$$

In this equation:
E is the field amplitude.
k is the wave number, i.e.

$$k = \frac{2\pi}{\lambda}.$$

u is the normalized defocus, i.e. $u=k \cdot NA^2 \cdot z$, wherein z is the actual defocus distance.
$\Phi$ is the phase aberration function.
$Y^+$ is the coordinate of the object point.

Equation (15) may be integrated, using a suitable representation for $\Phi$, in order to determine $A(\rho, \theta)$ completely.

For sufficiently small enough object area, it can generally be assumed that $\Phi$ does not depend on $Y^+$. In this case, $\Phi(\rho,\theta)$ can be expanded in a series of Zernike polynomials $R_n^m$, as described, for example, by Born & Wolf in *Principles of Optics*, 4th edition (Pergamon Press, 1970), in section 9.2, pages 464-467, which is incorporated herein by reference. Zernike representations of common aberrations include:

TABLE I

ZERNIKE POLYNOMIALS

| Spherical aberration | $\frac{1}{\sqrt{2}}A_{040}R_4^0(\rho) = \frac{1}{\sqrt{2}}A_{040}(6\rho^4 - 6\rho^2 + 1)$ |
|---|---|
| Coma | $A_{031}R_3^1(\rho)\cos(\theta) = A_{031}(3\rho^3 - 2\rho)\cos(\theta)$ |
| Astigmatism | $A_{022}R_2^2(\rho)\cos(2\theta) = A_{022}\rho^2\cos(2\theta)$ |

The magnitudes of the aberrations are represented by the corresponding Zernike polynomial coefficients $A_{inm}$. Standard software packages for optical design are capable of computing these coefficients for substantially any design that they generate.

The actual PSF determined at step 52, including aberrations, is then used in computing the expansion functions $\Theta_{m,k}$ that are applicable to the actual system 20, at an expansion step 54:

$$\Theta_{m,k}^c(\rho, \theta) \equiv \sqrt{(1+k)}A(\rho, \theta) \cdot \frac{J_{1+k}(\sigma\rho)}{\sigma\rho}\cos[(k-2m)\theta] \qquad (16)$$

$$\Theta_{m,k}^s(\rho, \theta) \equiv \sqrt{(1+k)}A(\rho, \theta) \cdot \frac{J_{1+k}(\sigma\rho)}{\sigma\rho}\sin[(k-2m)\theta]$$

These expansion functions are a generalized form of the expansion functions for a perfect optical system shown in equation (9). They are convolved with the transmission function $T(\rho, \theta)$ at step 46, in order to determine the aerial image intensity I, as given by equations (11) and (12).

Figure 6A:
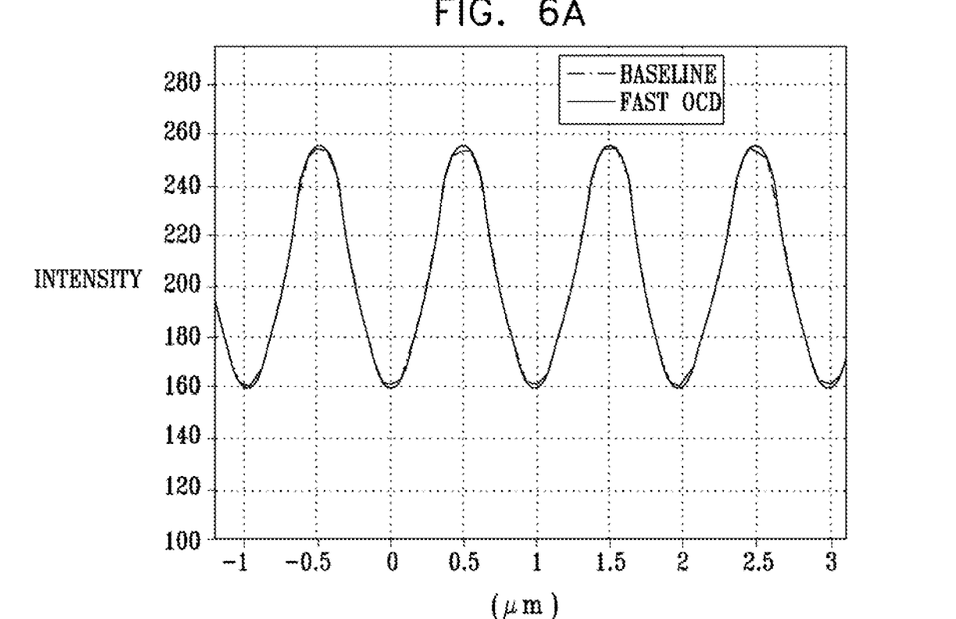
FIGS. 6A and 6B are plots of simulated aerial image intensity, in accordance with an embodiment of the present invention.
Figure 6B:
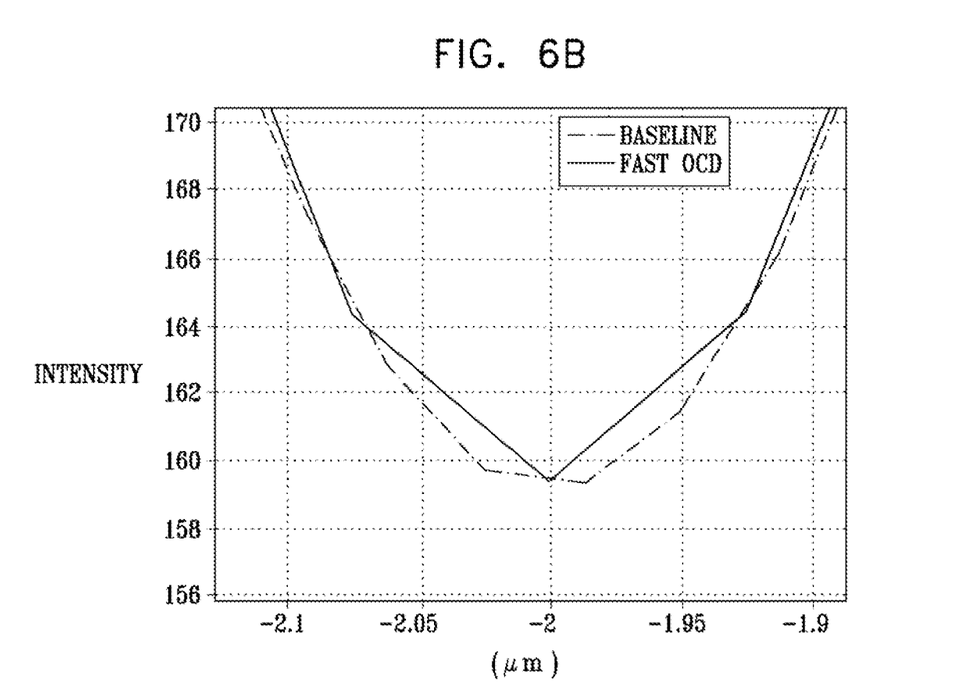

FIGS. 6A and 6B are plots that schematically illustrate simulated aerial image intensity calculated using the method described above, in accordance with an embodiment of the present invention. FIG. 6B is an enlarged detail of a small portion of FIG. 6A. The plots show the variation of intensity along a cross-section through a pattern of 0.5 μm lines with a pitch of 1 μm. In this example, λ=193 nm, NA=0.175 and the defocus (z) is 4 μm. The plots compare the "fast OCD" simulated image intensity, calculated using equations (11), (12) and (16), to a full "baseline" calculation computed by numerical integration of equation (1). The difference in the results of the two computations are insignificant even though the defocus assumed in this case is substantially larger than what is normally encountered in practical photolithography and mask inspection systems. Similar results are obtained in simulation of other aberrations, such as astigmatism and coma.

Figure 7:
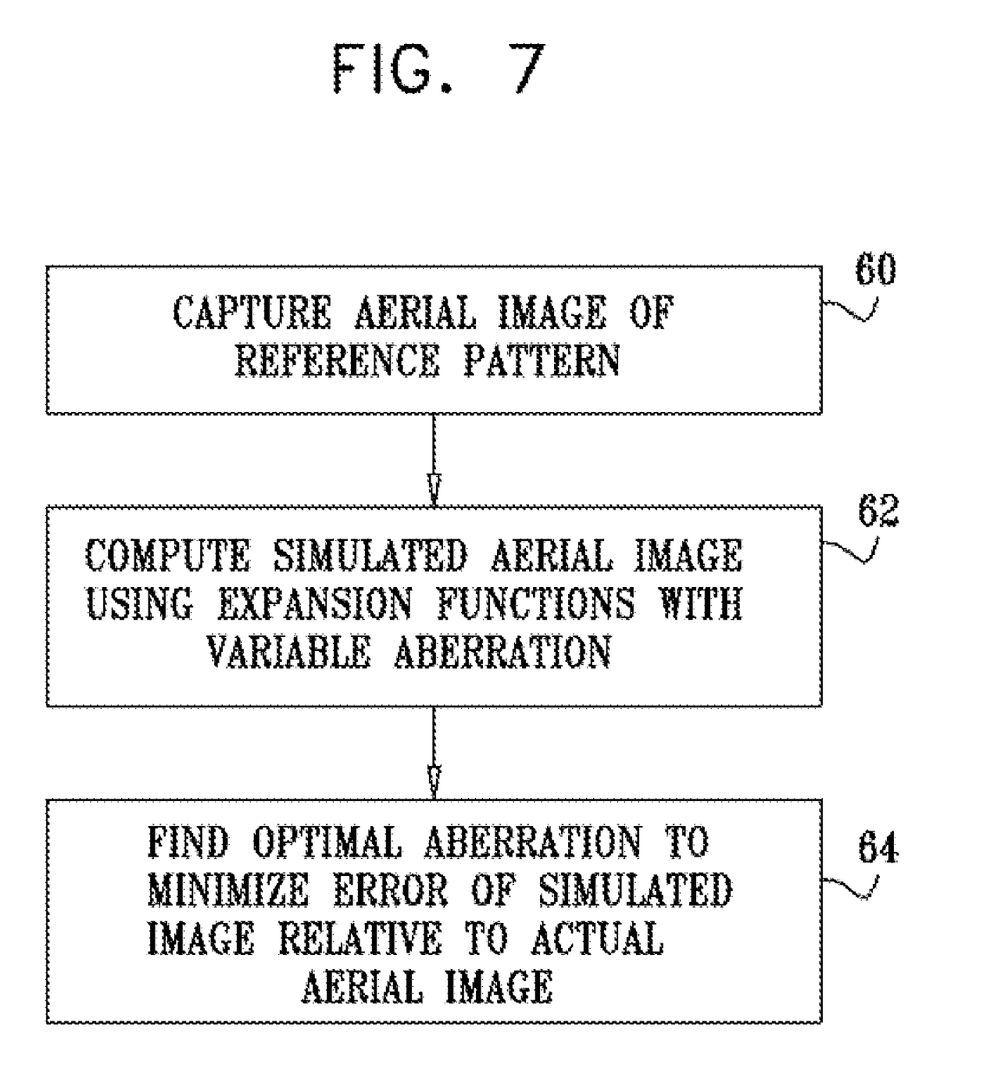
FIG. 7 is a flow chart that schematically illustrates a method for measuring aberrations of an optical system, in accordance with an embodiment of the present invention.

FIG. 7 is a flow chart that schematically illustrates a method for determining the aberrations in an optical system, such as system 20, in accordance with an embodiment of the present invention. The method uses the expansion functions given by equation (16) in a converse manner to that described above: Whereas in the method of FIG. 5, the expansion functions are determined based on known aberrations of the optical system, in the method of FIG. 7, the expansion functions are used, together with an actual aerial image, to estimate aberrations that are not exactly known. This method may thus be used, for example, to calibrate an optical system used in mask inspection or lithography.

To estimate the aberrations in system 20, a reference aerial image $I_{reference}$ is acquired by camera 36, at an image acquisition step 60. This image is acquired using mask 22 with a known reference pattern, giving a transmission function $T_{reference}$. An aberration vector is defined, based on the magnitudes of the aberrations that are expected to be present in system 20, for example:

$$\bar{\alpha} = (u_{defocus}, \alpha_{coma}, \alpha_{spherical}) \qquad (17)$$

Although for the sake of simplicity, this vector includes only defocus, coma and spherical aberration components, $\bar{\alpha}$ may be expanded to include other aberrations, as well. The PSF of system 20 may then be expressed as $A(\rho, \theta, \bar{\alpha})$, which can be expanded in terms of the aberrations, as shown above in equation (14), for example. Other, more precise parametric representations of the PSF are described hereinbelow. The expanded form of the PSF is inserted into equation (16), so that the expansion functions $\Theta_{m,k}$ explicitly contain the magnitudes of the aberration components as variable parameters. The expansion functions are then inserted into equations (11) and (12) in order to compute a simulated aerial image $I_{simulated}(\vec{x}, \bar{\alpha})$, at a simulation step 62.

The simulated aerial image, like the expansion functions on which it is based, contains the components of $\bar{\alpha}$ as parameters. In order to determine the values of these parameters in system 20, an error function is defined, based on the actual, reference image captured at step 60:

$$\varepsilon(\bar{\alpha}) = \int\int_S [I_{measured}(\vec{x}) - I_{simulated}(\vec{x}, \bar{\alpha})]^2 \, d\vec{x} \qquad (18)$$

Here the integral is taken over target plane 24. Methods of optimization known in the art may then be used to find the vector $\bar{\alpha}$ that minimizes the error function $\varepsilon$, at an optimization step 64. The components of $\bar{\alpha}$ ($u_{defocus}$, $\alpha_{coma}$, $\alpha_{spherical}$) that are found in this manner give the magnitudes of the actual aberrations in system 20.

Various methods may be used to expand the PSF $A(\rho, \theta, \bar{\alpha})$ in terms of the aberration vector components. One method is a Taylor series:

$$A(\rho, \theta, \bar{\alpha}) = A(\rho, \theta)|_{\bar{\alpha}=0} + \nabla_\alpha A|_{\bar{\alpha}=0} \cdot \Delta\bar{\alpha} + \frac{1}{2}\nabla_\alpha \nabla_\alpha A|_{\bar{\alpha}=0} \cdot \Delta\bar{\alpha}^2 + \ldots \qquad (19)$$

Here the gradient $\nabla_\alpha$ is made up of the partial derivatives of A with respect to each of the components of $\bar{\alpha}$, and the terms of $\nabla_\alpha \nabla_\alpha A$ include cross derivatives, as well. Aberration-based convolution components (in place of the generalized convolution components of equation (11)), may then be defined as follows:

$$\psi_{m,n}^{C,0}(\rho, \theta, \sigma) \equiv \qquad \text{[equation (20)]}$$

$$\sqrt{1+m} \cdot T(\rho, \theta) \otimes \left\{ \frac{J_1(\rho)}{\rho} \cdot \frac{J_{1+k}(\sigma\rho)}{\sigma\rho} \cos[(k-2m)\theta] \right\}$$

$$\psi_{m,n}^{C,\bar{\alpha}}(\rho, \theta, \sigma) \equiv \sqrt{1+m} \cdot T(\rho, \theta) \otimes$$

$$\left\{ \nabla_\alpha A|_{\bar{\alpha}=0} \cdot \frac{J_{1+k}(\sigma\rho)}{\sigma\rho} \cos[(k-2m)\theta] \right\}$$

$$\psi_{m,n}^{C,\bar{\alpha}\bar{\alpha}}(\rho, \theta, \sigma) \equiv \sqrt{1+m} \cdot T(\rho, \theta) \otimes$$

$$\left\{ \nabla_\alpha \nabla_\alpha A|_{\bar{\alpha}=0} \cdot \frac{J_{1+k}(\sigma\rho)}{\sigma\rho} \cos[(k-2m)\theta] \right\}; \ldots$$

This equation defines the cosine convolution components. The sine convolution components $\psi_{m,n}^{S,0}, \psi_{m,n}^{S,\bar{\alpha}}, \psi_{m,n}^{S,\bar{\alpha}\bar{\alpha}}(\rho, \theta, \sigma), \ldots$ are similarly defined. Note that for a given transmission function T, the convolution components may be precomputed offline.

The simulated aerial image may then be represented in terms of the convolution components, as follows:

$$I_{simulated}(\vec{x}, \bar{\alpha}) = \qquad \text{[equation (21)]}$$

$$\sum_m \sum_n \left| \psi_{m,n}^{C,0} + \sum_{\bar{\alpha}} \bar{\alpha} \cdot \psi_{m,n}^{C,\bar{\alpha}} + \frac{1}{2}\sum_{\bar{\alpha},\bar{\alpha}} \bar{\alpha}\bar{\alpha} \cdot \psi_{m,n}^{C,\bar{\alpha}\bar{\alpha}} + \right|^2 +$$

$$|\text{sin terms}|^2$$

This expression is inserted into equation (18), which is then minimized over the components of $\bar{\alpha}$.

In order to simplify the computation of the PSF and its derivatives, it is convenient to separate the defocus u out of the aberration vector $\bar{\alpha}$, and to express the aberrations in the PSF in terms of the Zernike polynomials $R_n^m$, as given above in Table I, for example:

$$A(\rho, \theta, u, \bar{\alpha}) = \int_0^{2\pi} \int_0^1 \exp\left(-i\frac{1}{2}u\xi^2 - \right. \qquad \text{[equation (22)]}$$

$$\left. i\rho\xi\cos(\theta - \varphi) + ik\sum_{nm} \alpha_{nm} R_n^m(\xi)\cos m\varphi \right) d\varphi \, d\xi$$

Here the terms $\alpha_{nm}$ represent the relevant components of $\bar{\alpha}$, for example $\alpha_{40}$ for spherical aberration and $\alpha_{31}$ for coma. The defocus component in the PSF may conveniently be expressed in terms of the Bauer expansion:

$$e^{-i\frac{1}{2}u\xi^2} = e^{-i\frac{u}{4}} \sqrt{\frac{2\pi}{u}} \sum_{s=0}^{\infty} (-i)^s (2s+1) J_{s+\frac{1}{2}}\left(\frac{u}{4}\right) R_{2s}^0(\xi) \qquad (23)$$

$$= e^{-i\frac{u}{4}} \left\{ \begin{array}{l} \left[2\cos\left(\frac{u}{4}\right) + \sqrt{\frac{u}{4}} J_{\frac{3}{2}}\left(\frac{u}{4}\right)\right] + \\ -i\sqrt{\frac{\pi u}{2}} \left[J_{\frac{1}{2}}\left(\frac{u}{4}\right) + J_{\frac{5}{2}}\left(\frac{u}{4}\right)\right](2\xi^2 - 1) + \ldots \end{array} \right\}$$

Inserting the terms of equation (23) into equation (22) allows the PSF to be expressed as the product of a series of defocus expansion terms $D_s$ multiplied by a Taylor expansion of the focused PSF, based on the relevant Zernike polynomial coefficients $\alpha_{nm}$:

$$A(\rho, \theta, u, \bar{\alpha}) = \qquad \text{[equation (24)]}$$

$$\sum_s D_s(u) \cdot \left\{ \begin{array}{l} A_s(\rho, \theta)\Big|_{\bar{\alpha}=0} + \sum_{m,n} \frac{\partial A_s}{\partial \alpha_{nm}}\Big|_{\bar{\alpha}=0} \cdot \Delta\bar{\alpha} + \\ \frac{1}{2}\sum_{m,n}\sum_{m',n'} \frac{\partial^2 A_s}{\partial \alpha_{nm} \partial \alpha_{n'm'}}\Big|_{\bar{\alpha}=0} \cdot \Delta\bar{\alpha}^2 + \ldots \end{array} \right\}$$

The constant prefactor in equation (15) is omitted here for simplicity. The terms of this series are determined analytically by differentiating equation (22) and integrating over $\varphi$.

The results for the leading terms of the Taylor expansion in equation (24) with s=0 and 1 are given in Table II below:

TABLE II

| | DEFOCUS/ABERRATION EXPANSION TERMS |
|---|---|
| $D_0$ | $\left[2\cos(\frac{u}{4}) + \sqrt{\frac{u}{4}}J_{\frac{3}{2}}(\frac{u}{4})\right]e^{-i\frac{u}{4}}$ |
| $A_0$ | $2\int_0^1 J_0(\xi\rho)\,d\xi$ |
| $\dfrac{\partial A_0}{\partial \alpha_{coma}}$ | $2\cos(\theta)\int_0^1 R_3^1(\xi)\cdot J_1(\xi\rho)\xi\,d\xi$ |
| $\dfrac{\partial^2 A_0}{\partial \alpha_{coma}^2}$ | $-\dfrac{1}{2}\int_0^1 \xi\,d\xi\{R_3^1(\xi)\}^2\{J_0(\rho\xi) - \cos(2\theta)J_2(\rho\xi)\}$ |
| $\dfrac{\partial A_0}{\partial \alpha_{spherical}}$ | $2i\int_0^1 R_4^0(\xi)J_0(\xi\rho)\xi\,d\xi$ |
| $\dfrac{\partial^2 A_0}{\partial \alpha_{spherical}^2}$ | $-\int_0^1 \xi\,d\xi\{R_4^0(\xi)\}^2 J_0(\rho\xi)$ |
| $D_1$ | $-i\sqrt{\dfrac{\pi u}{2}}\left[J_{\frac{1}{2}}(\frac{u}{4}) + J_{\frac{5}{2}}(\frac{u}{4})\right]e^{-i\frac{u}{4}}$ |
| $A_1$ | $2\int_0^1 R_2^0(\xi)J_0(\xi\rho)\xi\,d\xi$ |
| $\dfrac{\partial A_1}{\partial \alpha_{coma}}$ | $2\cos(\theta)\int_0^1 R_3^1(\xi)R_2^0(\xi)J_1(\xi\rho)\xi\,d\xi$ |
| $\dfrac{\partial A_1}{\partial \alpha_{spherical}}$ | $2i\int_0^1 R_4^0(\xi)R_2^0(\xi)J_0(\xi\rho)\xi\,d\xi$ |

The representation of the PSF that is given by equation (24) and Table II is used in computing the cosine and sine convolution components $\Psi^C$ and $\Psi^S$, as shown above in equation (20). These components are then used in finding $I_{simulated}$, as given by equation (21). Minimization of $\epsilon$ (equation (18)) over u, $\alpha_{coma}$ and $\alpha_{spherical}$ has been found to give a good approximation of the actual aberrations in real optical systems.

It will be appreciated that the embodiments described above are cited by way of example, and that the present invention is not limited to what has been particularly shown and described hereinabove. Rather, the scope of the present invention includes both combinations and subcombinations of the various features described hereinabove, as well as variations and modifications thereof which would occur to persons skilled in the art upon reading the foregoing description and which are not disclosed in the prior art.

APPENDIX A

Derivation and Properties of the Kernel Eigenfunctions

For the case of a cylindrically-symmetrical kernel with no aberrations, as given by equation (5), K has the following form:

$$K(\rho_1, \rho_2, \theta_1, \theta_2) = \frac{J_1(\rho_1)}{\rho_1} \cdot \frac{J_1(\rho_2)}{\rho_2} \cdot \frac{J_1\left(\sigma\sqrt{\rho_1^2 + \rho_2^2 - 2\rho_1\rho_2\cos(\theta_1-\theta_2)}\right)}{\sigma\sqrt{\rho_1^2 + \rho_2^2 - 2\rho_1\rho_2\cos(\theta_1-\theta_2)}} \quad [\text{equation (25)}]$$

The main obstacle to solving equation (6) is the third part of equation (25). In order to solve this problem, we use Gegenbauer's addition theorem, which implies that:

$$\varpi = \sqrt{\rho_1^2 + \rho_2^2 - 2\rho_1\rho_2\cos(\theta_1-\theta_2)}\,; \tag{26}$$

$$\frac{J_1(\varpi)}{\varpi} = 2\sum_{k=0}^{\infty}(1+k)\frac{J_{1+k}(\sigma\rho_1)}{\sigma\rho_1}\frac{J_{1+k}(\sigma\rho_2)}{\sigma\rho_2}C_k^1(\cos(\theta_1-\theta_2));$$

$$C_k^1(\cos(\theta_1-\theta_2)) = \sum_{m=0}^{k}\cos[(k-2m)(\theta_1-\theta_2)]$$

Using the symmetry of the optical system, the eigenfunctions $\phi$ can be factored as follows:

$$\phi(\rho,\theta) = \phi(\rho) \cdot e^{im\theta} \tag{27}$$

Substituting this representation into equation (6) gives:

$$\int_0^\infty \int_0^{2\pi} K(\rho_1,\rho_2,\theta_1-\theta_2)\rho_2\varphi(\rho_2)\cdot e^{im\theta_2}\,d\rho_2 d\theta_2 = \lambda\varphi(\rho_1)\cdot e^{im\theta_1} \Rightarrow \tag{28}$$

$$\int_0^\infty \int_0^{2\pi} K(\rho_1,\rho_2,\theta_1-\theta_2)\rho_2\varphi(\rho_2)\cdot e^{im(\theta_2-\theta_1)}\,d\rho_2 d\theta_2 = \lambda\varphi(\rho_1)$$

To integrate out the $\Delta\theta = \theta_1 - \theta_2$ dependence of this equation, we note that the only part of equation (26) that is dependent on $\Delta\theta$ is $C_k^1$. The result of the integration is:

$$\int_0^{2\pi}\sum_{n=0}^{k}\cos[(k-2n)\Delta\theta]e^{im\Delta\theta}\,d\Delta\theta = \quad [\text{equation (29)}]$$

$$\begin{cases} |m| > k = & 0 \\ (|m| \le k) \,\&\, (m+k \text{ even}) = & 2\pi \\ (|m| \le k) \,\&\, (m+k \text{ odd}) = & 0 \end{cases}$$

Substituting this result into equation (25) gives the following reduced equation for $\phi_n^m(\rho)$:

$$\int_0^\infty \rho_2 d\rho_2 \cdot \frac{J_1(\rho_1)}{\rho_1} \cdot \frac{J_1(\rho_2)}{\rho_2} \cdot 2 \quad [\text{equation (30)}]$$

$$\sum_{k=m}^{\infty}{}'(1+k)\frac{J_{1+k}(\sigma\rho_1)}{\sigma\rho_1}\frac{J_{1+k}(\sigma\rho_2)}{\sigma\rho_2}\varphi^m(\rho_2) = \lambda^m\varphi^m(\rho_1)$$

The primed sum "$\Sigma$" in the above equation means that k increases from term to term in the series in steps of 2. This equation can be solved by multiplying both sides by $$\sqrt{(1+n)}\frac{J_1(\rho_1)}{\rho_1}\frac{J_{1+n}(\sigma\rho_1)}{\sigma\rho_1}\rho_1,$$

and then integrating with respect to $\rho_1$:

$$2\sum_{k=m}^{\infty}\int_0^{\infty}\rho_1 d\rho_1\sqrt{(1+n)}\sqrt{(1+k)}\frac{J_1(\rho_1)}{\rho_1} \quad \text{[equation (31)]}$$

$$\frac{J_{1+n}(\sigma\rho_1)}{\sigma\rho_1} \cdot \frac{J_1(\rho_1)}{\rho_1} \cdot \frac{J_{1+k}(\sigma\rho_1)}{\sigma\rho_1} \cdot \int_0^{\infty}\rho_2 d\rho_2$$

$$\sqrt{(1+k)}\frac{J_1(\rho_2)}{\rho_2} \cdot \frac{J_{1+k}(\sigma\rho_2)}{\sigma\rho_2}\varphi^m(\rho_2) =$$

$$\lambda^m \int_0^{\infty}\rho_1 d\rho_1\sqrt{(1+n)}\frac{J_1(\rho_1)}{\rho_1}\frac{J_{1+n}(\sigma\rho_1)}{\sigma\rho_1}\varphi^m(\rho_1)$$

We now define:

$$A_{n,k}^m \equiv \int_0^{\infty}\rho_1 d\rho_1\sqrt{(1+n)}\sqrt{(1+k)} \quad \text{[equation (32)]}$$

$$\frac{J_1(\rho_1)}{\rho_1}\frac{J_{1+n}(\sigma\rho_1)}{\sigma\rho_1} \cdot \frac{J_1(\rho_1)}{\rho_1} \cdot \frac{J_{1+k}(\sigma\rho_1)}{\sigma\rho_1};$$

$$B_k^m \equiv \int_0^{\infty}\rho_2 d\rho_2\sqrt{(1+k)}\frac{J_1(\rho_2)}{\rho_2} \cdot \frac{J_{1+k}(\sigma\rho_2)}{\sigma\rho_2}\varphi^m(\rho_2)$$

Equation (31) can then be rewritten simply as:

$$\sum_{k=m}^{\infty} A_{n,k}^m \cdot B_k^m = \lambda^{m,n} \cdot B_n^m \quad (33)$$

By truncating the sum in this equation, we get an algebraic eigenvalues wherein the eigenfunctions of equation (30) can now be written:

$$\phi_i^m(\rho,\theta) = \sum_{k=m}^{M}{}'B_k^{m,i}\sqrt{(1+k)}\frac{J_1(\rho)}{\rho} \cdot \frac{J_{1+k}(\sigma\rho)}{\sigma\rho}e^{im\theta} \quad (34)$$

Since the eigenfunctions $\phi_i^m$ and $\phi_i^{-m}$ are degenerate, we are free to choose any linear combination of them. For convenience, we choose the forms $^c\phi_i^m(\rho,\theta)$ and $^s\phi_i^m(\rho,\theta)$, as given in equation (7).

Because the matrices $A_{k,n}^m = A_{n,k}^m$ are symmetrical, all their eigenvalues are real. The matrices $A_{k,n}^m$ for different values of m can all be derived from $A_{k,n}^0$ by deleting the first m rows and columns:

$$A^0 = \begin{pmatrix} a_{11} & \cdots & a_{1M} \\ \vdots & \ddots & \vdots \\ a_{M1} & \cdots & a_{MM} \end{pmatrix}; \quad (35)$$

$$A^1 = \begin{pmatrix} a_{22} & \cdots & a_{2M} \\ \vdots & \ddots & \vdots \\ a_{M2} & \cdots & a_{MM} \end{pmatrix};$$

$$A^2 = \begin{pmatrix} a_{33} & \cdots & a_{3M} \\ \vdots & \ddots & \vdots \\ a_{M3} & \cdots & a_{MM} \end{pmatrix}; \text{etc.}$$

According to the Courant-Fisher theorem, if $\lambda_1 > \lambda_2 > \ldots > \lambda_N$ are the eigenvalues of $A^0$, and $\mu_1 > \mu_2 > \ldots > \mu_{N-1}$ are the eigenvalues of $A^1$, then:

$$\lambda_1 < \mu_1 < \lambda_2; \quad (36)$$
$$\lambda_2 < \mu_2 < \lambda_3;$$
$$\vdots$$
$$\lambda_{N-1} < \mu_{N-1} < \lambda_N;$$

This equation implies that the first eigenvalue will always correspond to m=0, and the second always to m=1. Thus, as noted above, in order to construct a kernel that will be certain to include the first n eigenfunctions (i.e., those corresponding to the n greatest eigenvalues), it is sufficient to compute the eigenfunctions (or expansion functions $\Theta$) up to m=n. The consequence of this theorem cam be seen in FIG. 3.

The derivation of equation (12) above relied on the orthogonality of the eigenvectors $B_k^{m,i}$. To demonstrate this orthogonality, we note first that the cross-integral between two eigenfunctions of the kernel K can be calculated as follows:

$$\langle ^c\phi_i^m(\rho,\theta) \cdot {}^c\phi_j^l(\rho,\theta)\rangle = \int_0^{\infty}\rho d\rho\int_0^{2\pi}d\theta \cdot \quad (37)$$

$$^c\phi_i^m(\rho,\theta) \cdot {}^c\phi_j^l(\rho,\theta)$$

$$= = \int_0^{\infty}\rho d\rho\int_0^{2\pi}d\theta \sum_{k=m}^{M}$$

$$B_k^{m,i}\sqrt{(1+k)}\frac{J_1(\rho)}{\rho} \cdot$$

$$\frac{J_{1+k}(\sigma\rho)}{\sigma\rho}\cos(m\theta) \cdot$$

$$\sum_{k'=1}^{M}B_{k'}^{l,j}\sqrt{(1+k')}\frac{J_1(\rho)}{\rho} \cdot$$

$$\frac{J_{1+k'}(\sigma\rho)}{\sigma\rho}\cos(l\theta)$$

$$= 2\pi\delta(l-m)\int_0^{\infty}\rho d\rho\sum_{k=m}^{M}$$

$$\sum_{k'=l}^{M}B_{k'}^{l,j}B_k^{m,i}\sqrt{(1+k)(1+k')} \cdot$$

$$\frac{J_1(\rho)}{\rho} \cdot \frac{J_{1+k}(\sigma\rho)}{\sigma\rho}\frac{J_1(\rho)}{\rho} \cdot$$

$$\frac{J_{1+k'}(\sigma\rho)}{\sigma\rho}$$

$$= 2\pi\delta(l-m)\sum_{k=m}^{M}\sum_{k'=l}^{M}B_k^{m,j}B_k^{m,i}A_{k,k'}^l$$

$$= 2\pi\delta(l-m)\sum_{k=m}^{M}B_k^{m,j}B_k^{m,i} \cdot \lambda_j^m$$

Since $B_k^{m,i}$ are eigenvectors of a hermitian matrix, they are orthogonal. Therefore, to summarize:

$$\langle ^c\phi_i^m(\rho,\theta) \cdot {}^c\phi_j^l(\rho,\theta)\rangle = 2\pi\delta(1-m)\cdot\delta(i-j)\cdot\lambda_i^m \quad (38)$$

Using these results, equation (10) can be rewritten as follows to arrive at equation (12):

$$I(\vec{x}) = \sum_{m=0}^{M} \sum_{i=1}^{n} \lambda_i \{|T \otimes {}^C\phi_i^m|^2 + |T \otimes {}^S\phi_i^m|^2\} \quad (39)$$

$$= \sum_{m} (\psi_{m,1}^C \quad \cdots \quad \psi_{m,M-m}^C)$$

$$\begin{pmatrix} B_1^{m,1} & \cdots & B_{M-m}^{m,1} \\ \vdots & \ddots & \vdots \\ B_1^{m,M-m} & \cdots & B_{M-m}^{m,M-n} \end{pmatrix}^T \cdot$$

$$\begin{pmatrix} B_1^{m,1} & \cdots & B_{M-m}^{m,1} \\ \vdots & \ddots & \vdots \\ B_1^{m,M-m} & \cdots & B_{M-m}^{m,M-n} \end{pmatrix} \begin{pmatrix} \psi_{m,1}^C \\ \vdots \\ \psi_{m,M-m}^C \end{pmatrix}$$

$$= \sum_{m=0}^{M} \sum_{i=1}^{n} |\psi_{m,i}^C|^2 + |\psi_{m,i}^S|^2$$

by the orthogonally of the eigenvectors $B_k^{m,i}$.

When the optical system is subject to aberrations, the kernel of equation (25) is modified as follows:

$$K(\rho_1, \rho_2, \theta_1, \theta_2) = A(\rho_1, \theta_1) \cdot A^*(\rho_2, \theta_2) \cdot \quad [\text{equation (40)}]$$

$$\frac{J_1\left(\sigma\sqrt{\rho_1^2 + \rho_2^2 - 2\rho_1\rho_2\cos(\theta_1 - \theta_2)}\right)}{\sigma\sqrt{\rho_1^2 + \rho_2^2 - 2\rho_1\rho_2\cos(\theta_1 - \theta_2)}}$$

$$= 2\sum_{k=0}^{\infty} (1+k)A(\rho_1, \theta_1) \cdot A^*(\rho_2, \theta_2) \cdot$$

$$\frac{J_{1+k}(\sigma\rho_1)}{\sigma\rho_1} \frac{J_{1+k}(\sigma\rho_2)}{\sigma\rho_2} C_k^1(\cos(\theta_1 - \theta_2))$$

$$== 2\sum_{k=0}^{\infty} (1+k)A(\rho_1, \theta_1) \cdot A^*(\rho_2, \theta_2) \cdot$$

$$\frac{J_{1+k}(\sigma\rho_1)}{\sigma\rho_1} \frac{J_{1+k}(\sigma\rho_2)}{\sigma\rho_2} \sum_{m=0}^{k}$$

$$\cos[(k-2m)(\theta_1 - \theta_2)]$$

$$= 2\sum_{k=0}^{\infty}\sum_{m=0}^{k} (1+k)A(\rho_1, \theta_1) \cdot A^*(\rho_2, \theta_2) \cdot$$

$$\frac{J_{1+k}(\sigma\rho_1)}{\sigma\rho_1} \frac{J_{1+k}(\sigma\rho_2)}{\sigma\rho_2} \cdot$$

$$\{\cos[(k-2m)\theta_1] \cdot \cos[(k-2m)\theta_2] +$$

$$\sin[(k-2m)\theta_1] \cdot \sin[(k-2m)\theta_2]\}$$

It can be seen in this equation that the radial and angular parts of the kernel parable, as in equation (25).

Equation (40) can be solved by multiplying both sides of the equation by $$\sqrt{1+k} \cdot A(\rho_1, \theta_1) \cdot \frac{J_{1+k}(\sigma\rho_1)}{\sigma\rho_1} \cos[(k-2m)\theta_1]$$

and $$\sqrt{1+k} \cdot A(\rho_1, \theta_1) \cdot \frac{J_{1+k}(\sigma\rho_1)}{\sigma\rho_1} \sin[(k-2m)\theta_1],$$

and then integrating, as in equation (31). The resulting eigenfunctions are given by equation (13) above. The secular matrix in this case is given by:

$$A_{n,k}^{m,l} \equiv \int_0^{\infty} \rho_1 d\rho_1 \sqrt{(1+n)} \sqrt{(1+k)} |A(\rho_1, \theta_1)|^2 \cdot \cdot \quad (41)$$

$$\frac{J_{1+n}(\sigma\rho_1)}{\sigma\rho_1} \cdot \frac{J_{1+k}(\sigma\rho_1)}{\sigma\rho_1} \cdot \cos[(k-2l)\theta_1] \cdot \cos[(n-2m)\theta_1]$$

When the expansion functions of equation (16) are used, however, the aerial image intensity can be calculated without explicitly finding the terms of this matrix.

The invention claimed is:

1. A method for determining characteristics of an optical system, comprising:
   projecting radiation through a mask using the optical system so as to form a reference aerial image;
   generating a simulated aerial image by convolving a transmission function of the mask with a mathematical model of the optical system, the model comprising a variable parameter representative of a magnitude of an aberration of the optical system, wherein generating the simulated aerial image comprises defining a kernel function representing characteristics of the optical system, and creating the mathematical model as a coherent decomposition of the optical system into a series of expansion functions, which are components of eigenfunctions of the kernel function, without computing eigenvalues of the kernel function; and
   comparing the simulated aerial image to the reference aerial image in order to determine the magnitude of the aberration.

2. The method according to claim 1, wherein comparing the simulated aerial image to the reference aerial image comprises defining an error function responsively to a difference between the simulated aerial image to the reference aerial image, and varying the parameter so as to minimize the error function.

3. The method according to claim 2, wherein generating the simulated aerial image comprises representing a point spread function (PSF) of the optical system as a series of aberration terms having respective coefficients, and wherein varying the parameter comprises adjusting the respective coefficients of the aberrations terms.

4. The method according to claim 3, wherein representing the PSF comprises expressing the PSF as a Taylor series in terms of the coefficients of the aberration terms.

5. The method according to claim 2, wherein generating the simulated aerial image comprises representing a point spread function (PSF) of the optical system in terms of a defocus of the optical system, and wherein varying the parameter comprises determining a magnitude of the defocus.

6. The method according to claim 5, wherein representing the PSF comprises expressing the PSF as a product of a first series of first terms representing the defocus by a second series of second terms representing the aberration.

7. The method according to claim 1, wherein generating the simulated aerial image comprises determining a coherence characteristic of the optical system, and creating the mathematical model as a coherent decomposition of the optical system based on the coherence characteristic, the decomposition comprising a series of expansion functions having angular and radial components that are expressed as explicit functions.

8. Apparatus for determining characteristics of an optical system, comprising:
- an imaging device, which is arranged capture a reference aerial image formed by projecting radiation through a mask using the optical system; and
- an image processor, which is adapted to generate a simulated aerial image by convolving a transmission function of the mask with a mathematical model of the optical system, the model comprising a variable parameter representative of a magnitude of an aberration of the optical system, and to compare the simulated aerial image to the reference aerial image in order to determine the magnitude of the aberration, wherein the image processor is further adapted, responsively to a kernel function representing characteristics of the optical system, to create the mathematical model as a coherent decomposition of the optical system into a series of expansion functions, which are components of eigenfunctions of the kernel function, without computing eigenvalues of the kernel function.

9. The apparatus according to claim 8, wherein the image processor is adapted to determine an error function responsively to a difference between the simulated aerial image to the reference aerial image, and to vary the parameter so as to minimize the error function.

10. The apparatus according to claim 9, wherein the image processor is adapted to represent a point spread function (PSF) of the optical system as a series of aberration terms having respective coefficients, and to adjust the respective coefficients of the aberration terms so as to minimize the error function.

11. The apparatus according to claim 10, wherein the image processor is adapted to represent the PSF as a Taylor series in terms of the coefficients of the aberration terms.

12. The apparatus according to claim 9, wherein the image processor is adapter to represent a point spread function (PSF) of the optical system in terms of a defocus of the optical system, and to vary the parameter so as to determine a magnitude of the defocus.

13. The apparatus according to claim 12, wherein the image processor is adapted to express the PSF as a product of a first series of first terms representing the defocus by a second series of second terms representing the aberration.

14. The apparatus according to claim 8, wherein the image processor is adapted to create the mathematical model as a coherent decomposition of the optical system based on a coherence characteristic of the optical system, and creating, the decomposition comprising a series of expansion functions having angular and radial components that are expressed as explicit functions.

15. A computer software product for determining characteristics of an optical system, the product comprising a computer-readable medium in which program instructions are stored, which instructions, when read by a computer, cause the computer to receive a reference aerial image formed by projecting radiation trough a mask using the optical system, and to generate a simulated aerial image by convolving a transmission function of the mask with a mathematical model of the optical system, the model comprising a variable parameter representative of a magnitude of an aberration of the optical system wherein generating the simulated aerial image comprises defining a kernel function representing characteristics of the optical system and creating a mathematical model as a coherent decomposition of the optical system into a series of expansion functions, which are components of eigenfunctions of the kernel function, without computing eigenvalues of the kernel function, and to compare the simulated aerial image to the reference aerial image in order to determine the magnitude of the aberration.

* * * * *